United States Patent
Nishikawa

(10) Patent No.: US 7,223,146 B2
(45) Date of Patent: May 29, 2007

(54) METHOD OF MANUFACTURING ELECTROLUMINESCENT DISPLAY DEVICE WITH INTERLAYER INSULATING FILM HAVING CONVEX AND CONCAVE PORTIONS

(75) Inventor: Ryuji Nishikawa, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 365 days.

(21) Appl. No.: 10/378,082

(22) Filed: Mar. 4, 2003

(65) Prior Publication Data

US 2004/0017153 A1   Jan. 29, 2004

(30) Foreign Application Priority Data

Mar. 4, 2002 (JP) .................................. 2002-057166

(51) Int. Cl.
*H01J 9/00* (2006.01)

(52) U.S. Cl. .......................................... 445/23; 445/25
(58) Field of Classification Search ............... 445/23, 445/24, 25; 313/501–506, 504; 428/690, 428/917
See application file for complete search history.

(56) References Cited

U.S. PATENT DOCUMENTS 6,501,098 B2 * 12/2002 Yamazaki .................... 257/72
6,522,079 B1    2/2003 Yamada
6,628,086 B2 *  9/2003 Hayashi et al. ........... 315/169.3
6,787,796 B2 *  9/2004 Do et al. ...................... 257/40
6,936,847 B2 *  8/2005 Tanabe et al. ................ 257/72

FOREIGN PATENT DOCUMENTS

| JP | 63-313492 | 12/1988 |
| JP | 64-38998 | 2/1989 |
| JP | 2000-40584 | 2/2000 |
| JP | 2001-175200 | 6/2001 |
| KR | 2001-0050783 | 3/2003 |

* cited by examiner

*Primary Examiner*—Joseph Williams
(74) *Attorney, Agent, or Firm*—Morrison & Foerster LLP

(57) ABSTRACT

A concave and convex portion is formed on the surface of the planarization insulating film. The surface of the anode also has a concave and convex portion, reflecting the concave and convex structure of the planarization insulating film. The hole transportation layer, the emissive layer, the electron transportation layer and the cathode are disposed on the anode through vacuum evaporation. The surface of the hole transportation layer, the emissive layer, the electron transportation layer, and the cathode has the concave and convex structure, respectively, reflecting the concave and convex structure on the surface of the anode. The effective light-emitting area of the emissive layer is larger than that of a conventional device. That is, a higher brightness can be achieved by increasing the effective light-emitting area of the EL device. Also, the life span of the EL device is extended while keeping its brightness at a conventional level.

11 Claims, 9 Drawing Sheets

METHOD OF MANUFACTURING ELECTROLUMINESCENT DISPLAY DEVICE WITH INTERLAYER INSULATING FILM HAVING CONVEX AND CONCAVE PORTIONS

BACKGROUND OF THE INVENTION

1. Field of Invention

This invention relates to an electroluminescenct display device and its manufacturing method.

2. Description of the Related Art

An electroluminescenct (referred to as EL hereinafter) display device with an EL element has been gathering attention as a display device substituting a CRT or an LCD. The development efforts for the EL display device with a thin film transistor (referred to as TFT hereinafter) as a switching device for driving the EL device have been made accordingly.

FIG. 15 is a plan view showing a pixel of an EL display device of the prior arts. FIG. 16 shows a cross-sectional view of the device along with the B—B cross-sectional line. A TFT for driving an organic EL device is disposed near the crossing of a gate signal line 51 with a gate electrode 11 and a drain signal line 52. A drain of the TFT is connected to the drain signal line 52 and a gate of the TFT to the gate signal line 51. A source of the TFT is connected to an anode 61 of the EL device. A plurality of the pixels is disposed in a matrix configuration in an actual EL display device.

A display pixel 110 is formed by disposing the TFT and the organic EL device sequentially on a substrate 10, which is a glass substrate, a resin sybstrate, a conductive substrate, or a semiconductor substrate. When the conductive substrate or the semiconductor substrate is used as the substrate 10, an insulating film made of SiO$_2$ or SiN should be disposed on the substrate first before forming the TFT.

First, the gate electrode 11 made of a metal with a high-melting point such as chrome (Cr) is disposed on the insulating substrate 10, and then a gate insulating film 12 and an active layer 13 made of p-Si film are sequentially disposed.

Ion doping is performed to a channel 13c of the active layer 13 located above the gate electrode 11 and to the areas located at both sides of the channel 13c using a stopper insulating film 14 as a mask. Furthermore, ion doping is performed with the both sides of the gate electrode 11 covered with resist, forming low density areas at the both sides of the gate electrode 11 and a source 13s and a drain 13d of high density areas each located outside of each of the low density areas. This configuration is known as the LDD (lightly doped drain).

Then an interlayer insulating film 15 is formed by sequentially disposing a SiO$_2$ film, a SiN film, and a SiO$_2$ film over the entire surface of the gate insulating film 12, the active layer 13 and the stopper insulating film 14. A drain electrode 16 is formed by filling a contact hole made corresponding to the drain 13d with a metal such as aluminum. Furthermore, a planarization insulating film 17 made of organic resin for planarization the surface is disposed on the entire surface.

A contact hole is formed in the planarization insulating film 17 at the location corresponding to the source 13s. Then, the anode 61, which also functions as a source electrode 18, made of ITO (Indium Tin Oxide) making a contact with the source 13s through the contact hole is formed on the planarization insulating film 17. The anode 61 is made of a transparent electrode such as ITO (Indium Tin Oxide). The EL device is disposed on the anode 61.

The organic EL device 60 has a conventional configuration, where the anode 61, a hole transportation layer 62 including a first hole transportation layer made of MTDATA (4, 4-bis(3-mathylphenylphenylamino) biphenyl) and a second hole transportation layer made of TPD (4, 4, 4-tris(3-methylphenylphenylamino) triphenylanine), an emissive layer 63 made of Bebq2 (bis(10-hydroxybenzo[h] quinolinato)beryllium) including quinacridone derivative, an electron transportation layer 64 made of Bebq2, and the cathode 65 made of either magnesium-indium alloy, aluminum, or aluminum alloy are disposed in this order.

The organic EL device 60 emits light by the electric current supplied through the driving TFT. In the organic El device 60, a hole injected from the anode 61 and an electron injected from the cathode 65 are recombined in the emissive layer and an exciton is formed by exciting an organic module forming the emissive layer 63. Light is emitted from the emissive layer 63 in a process of relaxation of the exciton and then released outside after going through the transparent anode 61 to the transparent insulating substrate 10.

The above-mentioned technology is described in, for example, Japanese Laid-Open Patent Publication No. Hei 2001-175200.

The plane area of the emissive layer 63 formed on the anode 61 defines the light-emitting area SO of the organic EL device 60, as shown in FIG. 16. Therefore, the larger the light-emitting area SO is, the brighter the organic EL device becomes. However, the larger light-emitting area SO usually requires the larger pixel area, which may cause the deterioration of fine display.

On the other hand, the life span of the organic EL device 60, that is, the duration till the brightness of the organic EL device 60 decreases to a certain point, is longer when the density of the current going through the organic EL device 60 is lower, as shown in FIG. 17. However, the brightness of the organic EL device 60 is low when the electric density is low.

Therefore, this invention is directed to the enlargement of the light-emitting area of the organic EL device as well as a higher brightness without making the individual pixel areas larger. Also, this invention is directed to the extension the life span of the organic EL device while keeping its brightness.

SUMMARY OF THE INVENTION

The invention provides an electroluminescenct display device that includes a thin film transistor disposed on a substrate, an insulating film disposed over the thin film transistor, an anode connected to a source or a drain of the thin film transistor through a contact hole formed in the insulating film, and an emissive layer disposed over the anode. This emissive layer is not flat. The display device also includes a cathode disposed over the emissive layer.

The invention also provides a manufacturing method of an electroluminescenct display device. The method includes disposing a thin film transistor on a substrate, disposing a planarization insulating film made of a photosensitive material over the thin film transistor, and performing a half exposure processing and a development processing on the planarization insulating film to form a concave and convex structure on a surface of the planarization insulating film. The method also includes disposing a photoresist layer with an opening portion on the surface of the planarization insulating film with the concave and convex structure, and performing a full exposure processing and a development processing on the planarization insulating film using the photoresist layer as a mask to form a contact hole in the planarization insulating film. The method further includes disposing an anode connected to a source or a drain of the thin film transistor through the contact hole, disposing an emissive layer over the anode, and disposing a cathode over the emissive layer.

The invention further provides another manufacturing method of an electroluminescenct display device. The method includes disposing a thin film transistor on a substrate, disposing an insulating film over the thin film transistor, and forming a concave and convex structure on a surface of the insulating film. The method also includes forming a contact hole in the insulating film with the concave and convex structure, disposing an anode connected to a source or a drain of the thin film transistor through the contact hole, disposing an emissive layer over the anode, and disposing a cathode over the emissive layer.

The invention also provides yet another manufacturing method of an electroluminescenct display device. The method includes disposing a thin film transistor on a substrate, disposing an interlayer insulating film over the thin film transistor, and forming a plurality of convex portions made of an insulating film on the interlayer insulating film. The method also includes disposing a planarization insulating film over the interlayer insulating film with the convex portions, forming a contact hole in the planarization insulating film, and disposing an anode connected to a source or a drain of the thin film transistor through the contact hole. The method further includes disposing an emissive layer over the anode and disposing a cathode over the emissive layer.

DETAILED DESCRIPTION OF THE INVENTION

Embodiments of this invention will be explained by referring to drawings above.

Figure 15:
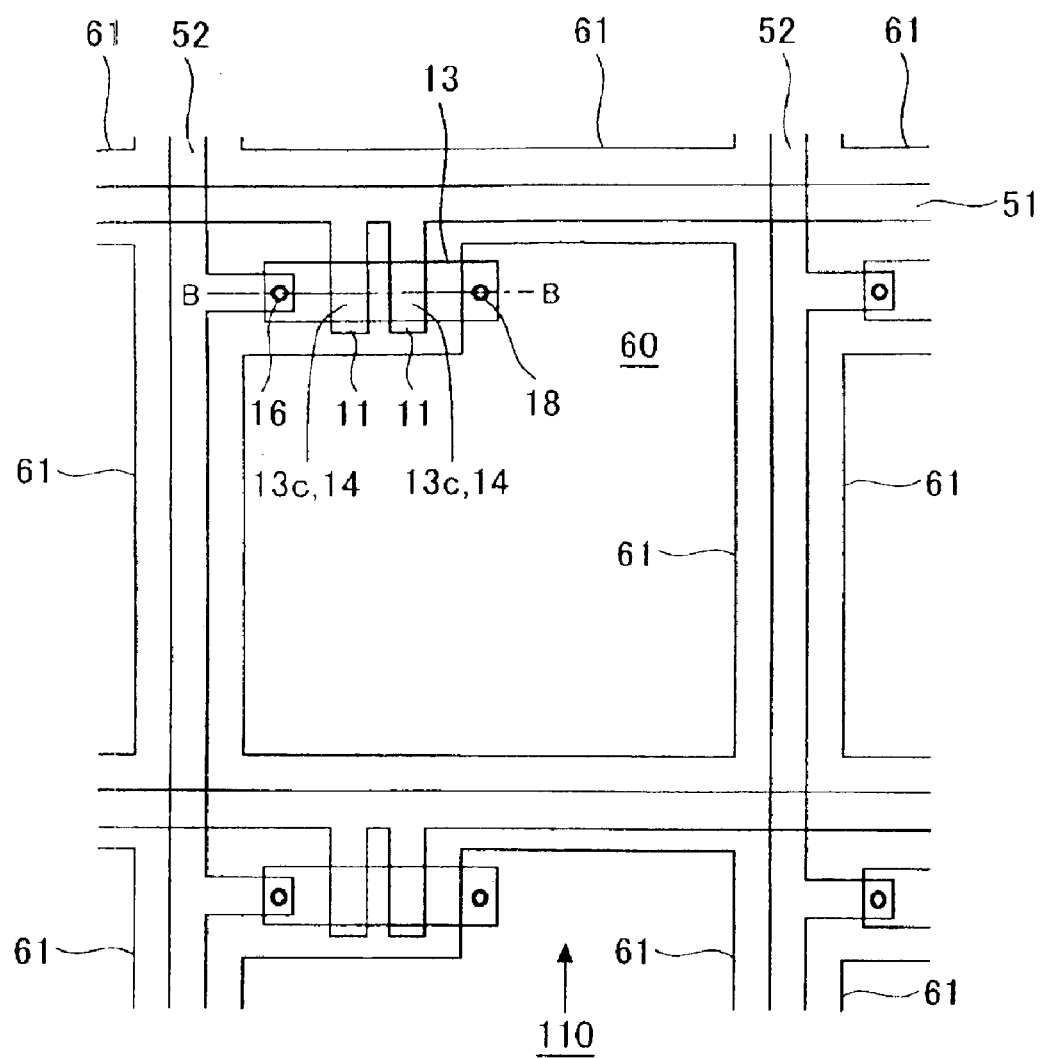
FIG. 15 is a plan view of a pixel of a conventional EL display device, which is applicable to the first and second embodiment.
Figure 16:
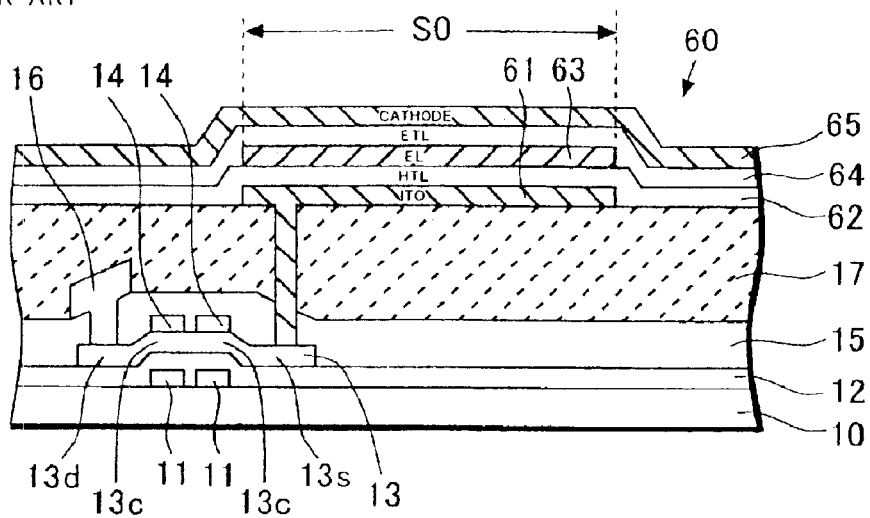
FIG. 16 is a cross-sectional view of the display device of FIG. 5 along line B—B line of FIG. 15.

The first embodiment of this invention will be described by referring to FIGS. 1–5. The same components of the display device as those in FIGS. 15, 16 are given the same reference numerals.

Figure 1:
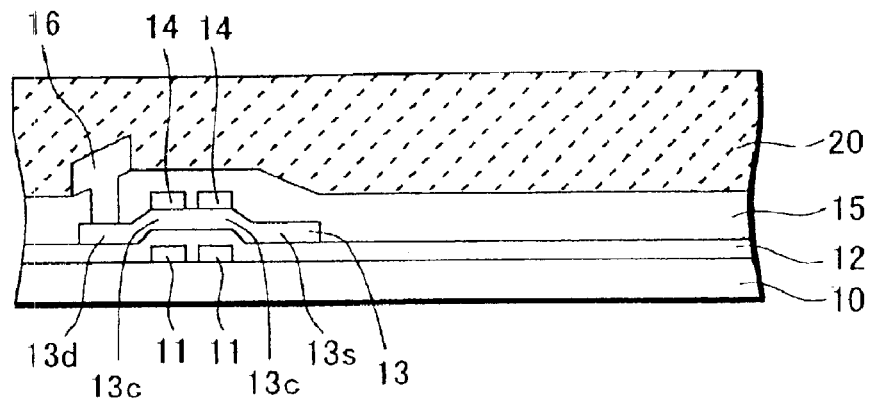
FIGS. 1–4 show process steps of manufacturing an electroluminescenct display device of the first embodiment of this invention.

A TFT is formed on an insulating substrate 10 as shown in FIG. 1. That is, a gate electrode 11 made of a metal with a high-melting point such as chrome (Cr) is disposed first on the insulating substrate 10, and then a gate insulating film 12 and an active layer 13 made of p-Si film are sequentially disposed.

Ion doping is performed to a channel 13c of the active layer 13 located above the gate electrode 11 and to the areas located at both sides of the channel 13c using a stopper insulating film 14 as a mask. Furthermore, ion doping is performed with the both sides of the gate electrode 11 covered with resist, forming low density areas at the both sides of the gate electrode 11 and a source 13s and a drain 13d of high density areas each located outside of each of the low density areas. This configuration is an LDD configuration.

Then an interlayer insulating film 15 is formed by sequentially disposing a SiO$_2$ film, a SiN film, and a SiO$_2$ film over the entire surface of the gate insulating film 12, the active layer 13 and the stopper insulating film 14. A drain electrode 16 is formed by filling a contact hole made corresponding to the drain 13d with a metal such as aluminum. Furthermore, a planarization insulating film 20 made of photosensitive resin (for example, JSR-315 produced by the Nippon Gousei Gomu) is disposed (FIG. 1).

Figure 2:
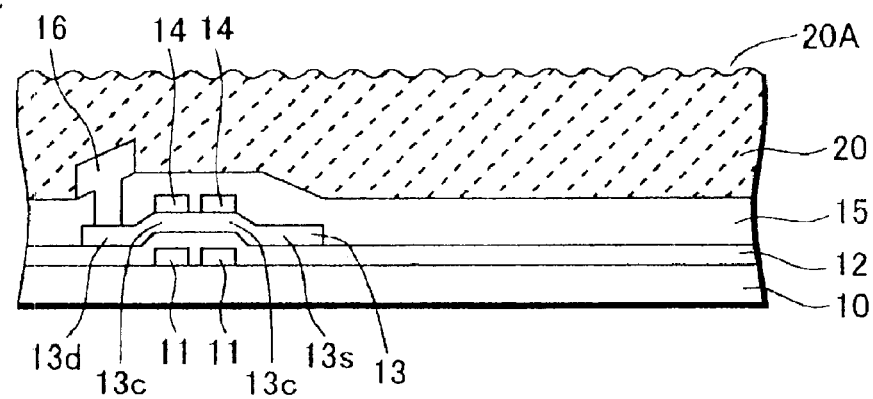

The surface of the planarization insulating film 20 is coarsened by performing a half exposure processing, followed by a development processing, as shown in FIG. 2. This forms a concave and convex structure 20A. The amount of the exposure of the "half exposure" processing is approximately 20–40% of the exposure required to form the contact hole in the planarization insulating film 20.

Figure 3:
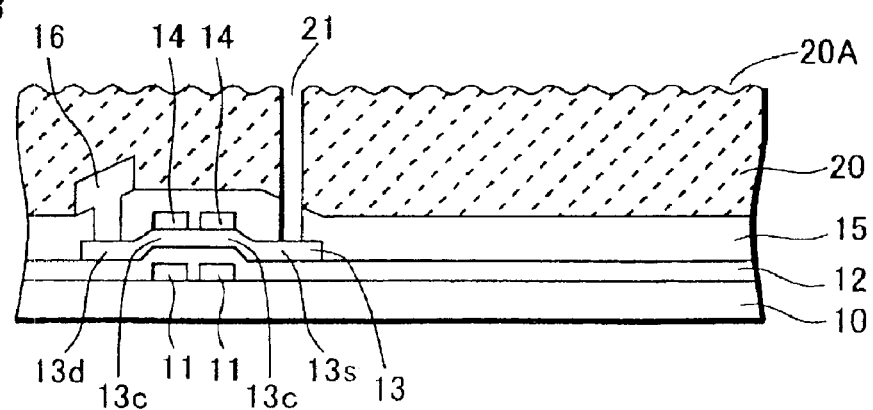

Next, a contact hole 21 is formed above the source 13s of the TFT as shown in FIG. 3. The ordinary 100% exposure is performed for this development processing by using a mask (not shown in the figure) having an opening portion at the location corresponding to the source 13s of the TFT. A part of the planarization insulating film 20 corresponding to the opening portion is removed. Then, the planarization insulting film 15 is selectively removed by etching, exposing the surface of the source 13s of the TFT.

Figure 4:
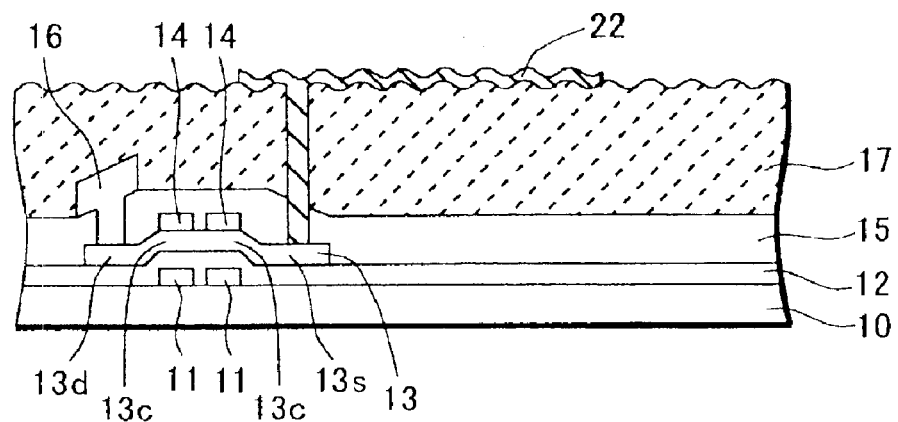

Then, an anode 22 made of ITO is disposed on the planarization insulating film 20 as shown in FIG. 4. The anode 22 is patterned in such way that it is connected to the source s of the TFT through the contact hole 21. The concave and convex structure is formed on the anode 22 reflecting the concave and convex structure of the planarization insulating film 20.

Figure 5:
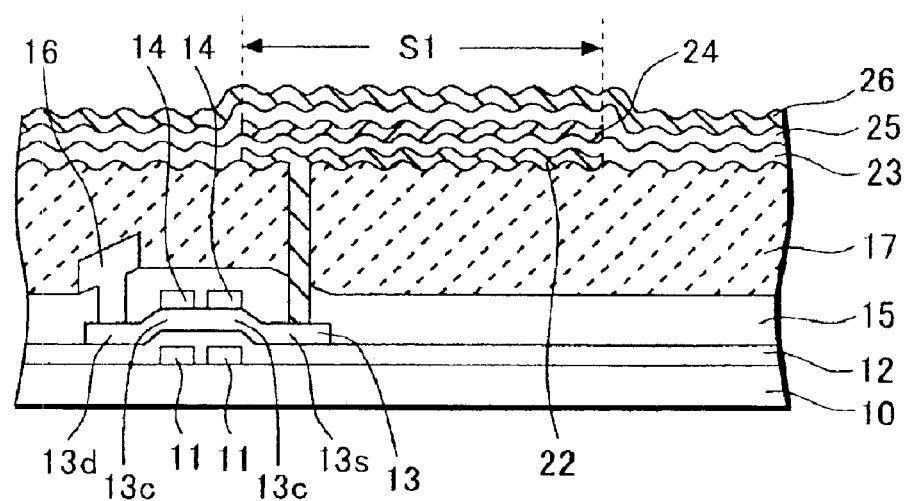
FIG. 5 is a cross-sectional view of the display device of the first embodiment.

Then, a hole transportation layer 23 including a first hole transportation layer made of MTDATA (4, 4-bis (3-mathylphenylphenylamino) biphenyl) and a second hole transportation layer made of TPD (4, 4, 4-tris (3-methylphenylphenylamino) triphenylanine), an emissive layer 24 made of Bebq2 (bis(10-hydroxybenzo[h] quinolinato)beryllium) including quinacridone derivative, an electron transportation layer 25 made of Bebq2, and the cathode 26 made of either magnesium-indium alloy, aluminum, or aluminum alloy are disposed in this order on the anode 22 with the concave and convex structure on the surface, as shown in FIG. 5. The hole transportation layer 23, the emissive layer 24, the electron transportation layer 25, and a cathode 26 are formed by a vacuum evaporation method using a shadow mask. The emissive layer 24 is disposed for each of the pixels on the anode 24, and the hole transportation layer 23, the electron transportation layer 25, and the cathode 26 are disposed on the entire surface of the display area of the EL display device in FIG. 5.

Figure 17:
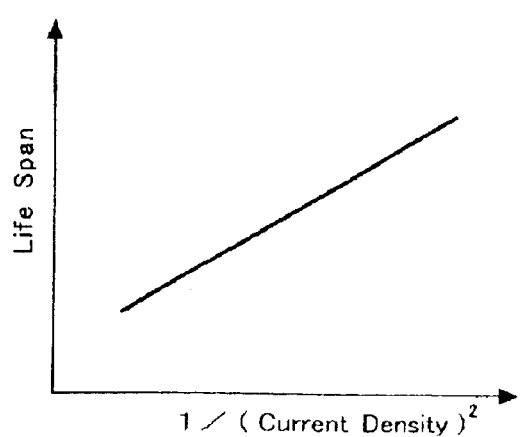
FIG. 17 shows the relationship between the life span of an organic EL display device and the electric current density for use with the display device.

Each of the hole transportation layer 23, the emissive layer 24, the electron transportation layer 25, and the cathode 26 has similar concave and convex structure as they reflect the concave and convex structure of the anode 22. The effective light-emitting area S1 of the emissive layer 24 increases compared to the light-emitting area S0 of the conventional device. Therefore, the brightness K increases in proportion to the ratio, S1/S0, if the electric current density per unit area remains the same. On the other hand, the electric current density decreases in proportion to the ratio, S0/S1, if the brightness K remains the same. Therefore, the life span of the organic EL device will be extended accordingly (FIG. 17).

Ideally, the concave and convex structure of the emissive layer 24 should have a hemispherical surface, because it will lead to the maximum light-emitting area. It will double the light-emitting area compared to the case where no concave and convex structure exists on the surface of the emissive layer. The surface area of one convex portion (or one concave portion) is $2\pi r^2$, and the surface area of a circle is $\pi r^2$, when the radius of the sphere is r. Therefore, the surface area is doubled. In this case, the life span of the organic EL device will be four times longer.

In this embodiment, an inorganic insulating film made of an insulating material, such as $SiO_2$ or SiN, can be utilized instead of the planarization insulating film 20 made of photosensitive resin. The method of forming a concave and convex structure on the surface of the inorganic insulating film will be described below.

A photoresist is disposed on the surface of the inorganic insulating film and a full exposure processing and a development processing is performed on the photoresist, to make a plurality of islands made of the photoresist. Then, the surface of the insulating film is etched by using the photoresist as an etching mask, and the photoresist is removed, acquiring a concave and convex structure on the surface of the inorganic insulating film.

As an alternative method, a photoresist is disposed on the surface of the inorganic insulating film and a half exposure processing and a development processing are performed on the photoresist, forming a concave and convex structure on the surface of the photoresist. Then, the photoresist and the underlying insulating film are sequentially etched by using a RIE (reactive ion etching) technique and the remaining photoresist is removed. As a result, a concave and convex structure is formed on the surface of the inorganic insulating film.

The second embodiment of this invention will be described by referring to FIGS. 6–12. The same reference numerals are given to the same components as those in FIGS. 15 and 16.

Figure 6:
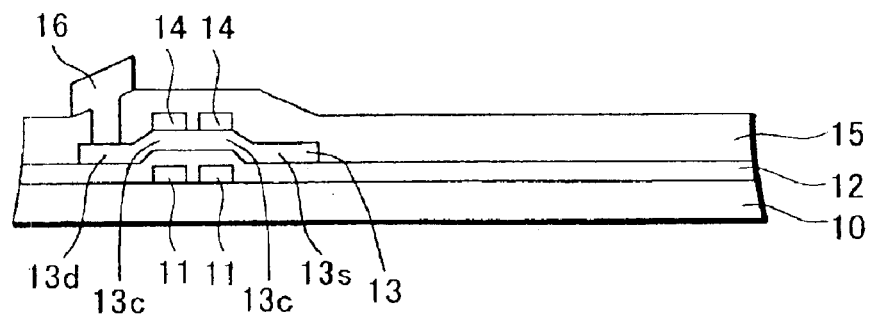
FIGS. 6–11 show process steps of manufacturing an electroluminescenct display device of the second embodiment of this invention.
Figure 7:
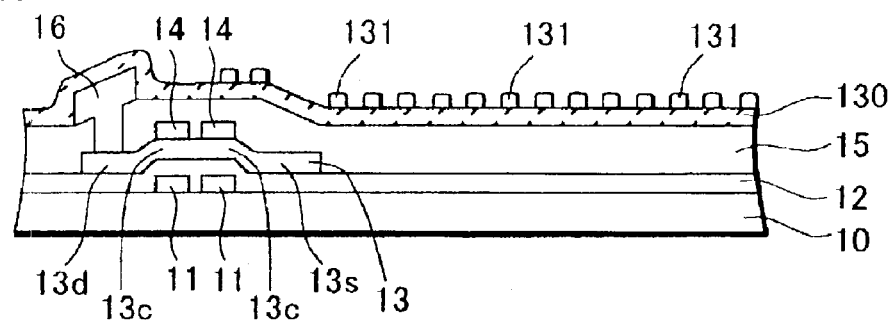
Figure 8:
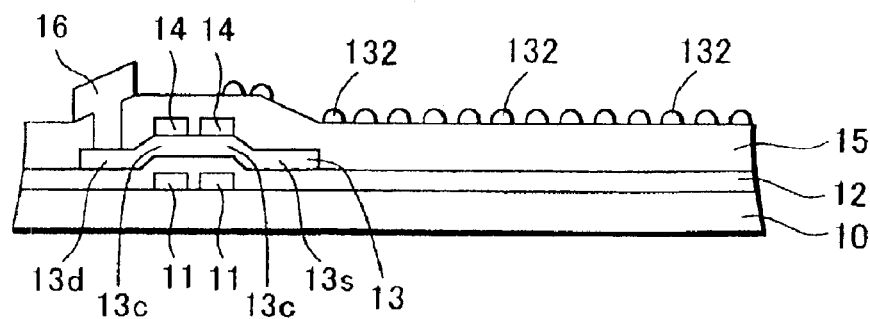

The interlayer insulating film 15 and the drain electrode 16 are disposed on the insulating substrate 10 as shown in FIG. 6. These processes are the same as those in the first embodiment.

Next, an insulating film 130 (for example, $SiO_2$ film) is disposed through a CVD method, and a photo resist 131, which is patterned into a plurality of islands, is formed on the insulating film 130.

The insulating film 30 is etched by using the photo resist 131 as an etching mask, and then the photo resist 131 is removed, acquiring a plurality of convex portions 132 made of the insulating film on the interlayer insulating film 15.

Figure 9:
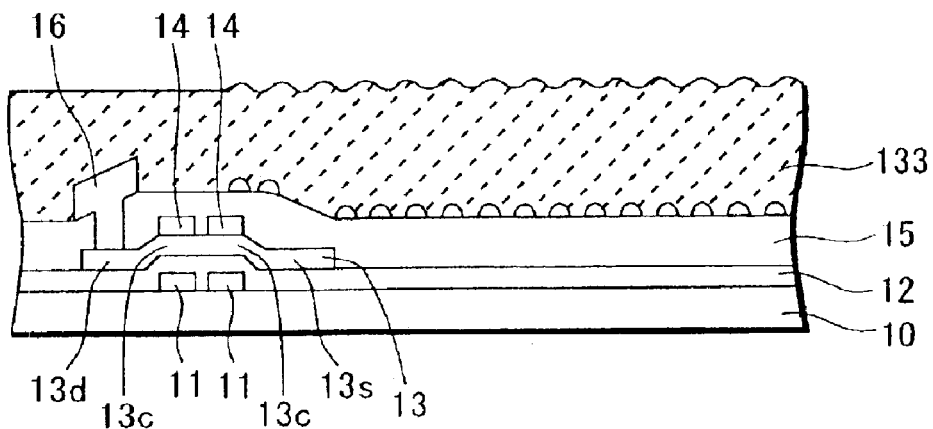

Then a planarization insulating film 133 made of organic resin is disposed as shown in FIG. 9. The surface of the planarization insulating film 133 has a concave and convex structure as it inherits a plurality of the convex portions 132 underneath.

Figure 10:
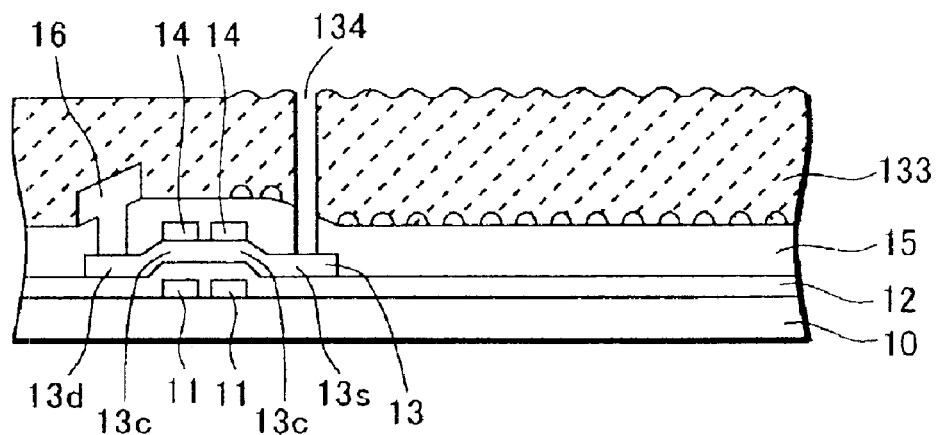
Figure 11:
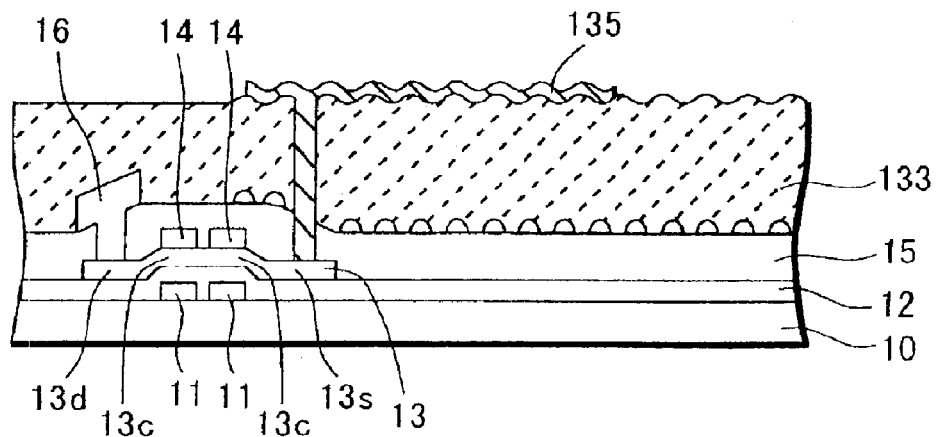

A contact hole 134 is formed above the source 13s of the TFT by selectively etching the planarization insulating film 133 and the interlayer insulating film 15 as shown in FIG. 10. Then, an anode 135 made of ITO is formed on the planarization insulating film 133 as shown in FIG. 11. The anode 135 is patterned in such way that it is connected to the source 13s of the TFT through the contact hole 134. The concave and convex structure is also formed on the anode 135 reflecting the concave and convex structure of the planarization insulating film 133.

Figure 12:
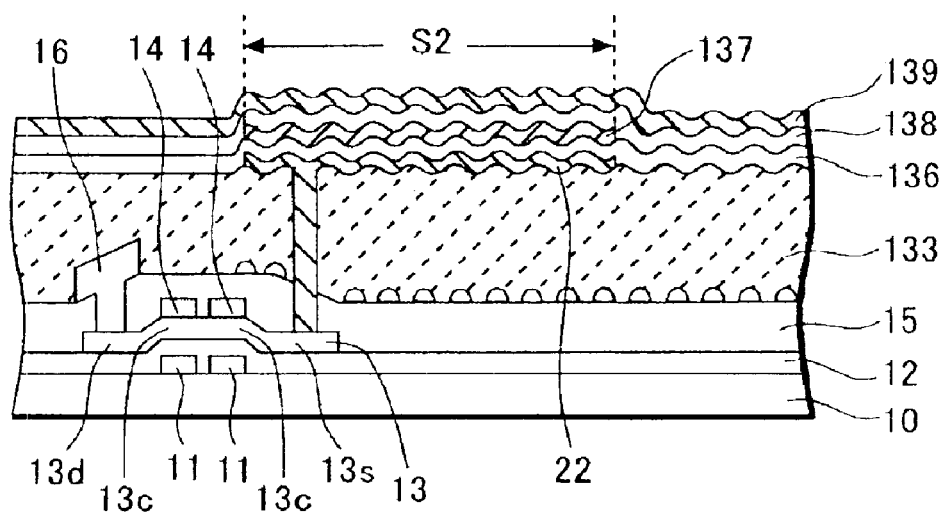
FIG. 12 is a cross-sectional view of the display device of the second embodiment.

Then, a hole transportation layer 136, an emissive layer 137, an electron transportation layer 138, and the cathode 139 of the organic EL device are disposed through the vacuum evaporation method using a shadow mask on the anode 135 with the concave and convex structure on the surface as in the first embodiment, as shown in FIG. 12. The emissive layer 137 is disposed for each of the pixels on the anode 135, and the hole transportation layer 136, the electron transportation layer 138, and the cathode 139 are disposed on the entire surface of the display area of the EL display device.

The each surface of the hole transportation layer 136, the emissive layer 137, the electron transportation layer 138, and the cathode 138 of the organic EL device has the concave and convex structure reflecting the concave and convex structure of the anode 135. Therefore, the effective light-emitting area S2 of the emissive layer 137 increases compared to the area S0 of the prior arts.

The first and second embodiments use a display device having a display pixel with one TFT (the TFT for driving the organic EL device). However, this invention is not limited to this configuration. This invention is also applicable to a display device having a display pixel with two TFTs (the TFT for switching and the TFT for driving). The third embodiment of this embodiment uses such a device configuration, and will be described hereinafter with reference to FIGS. 13–14B.

Figure 13:
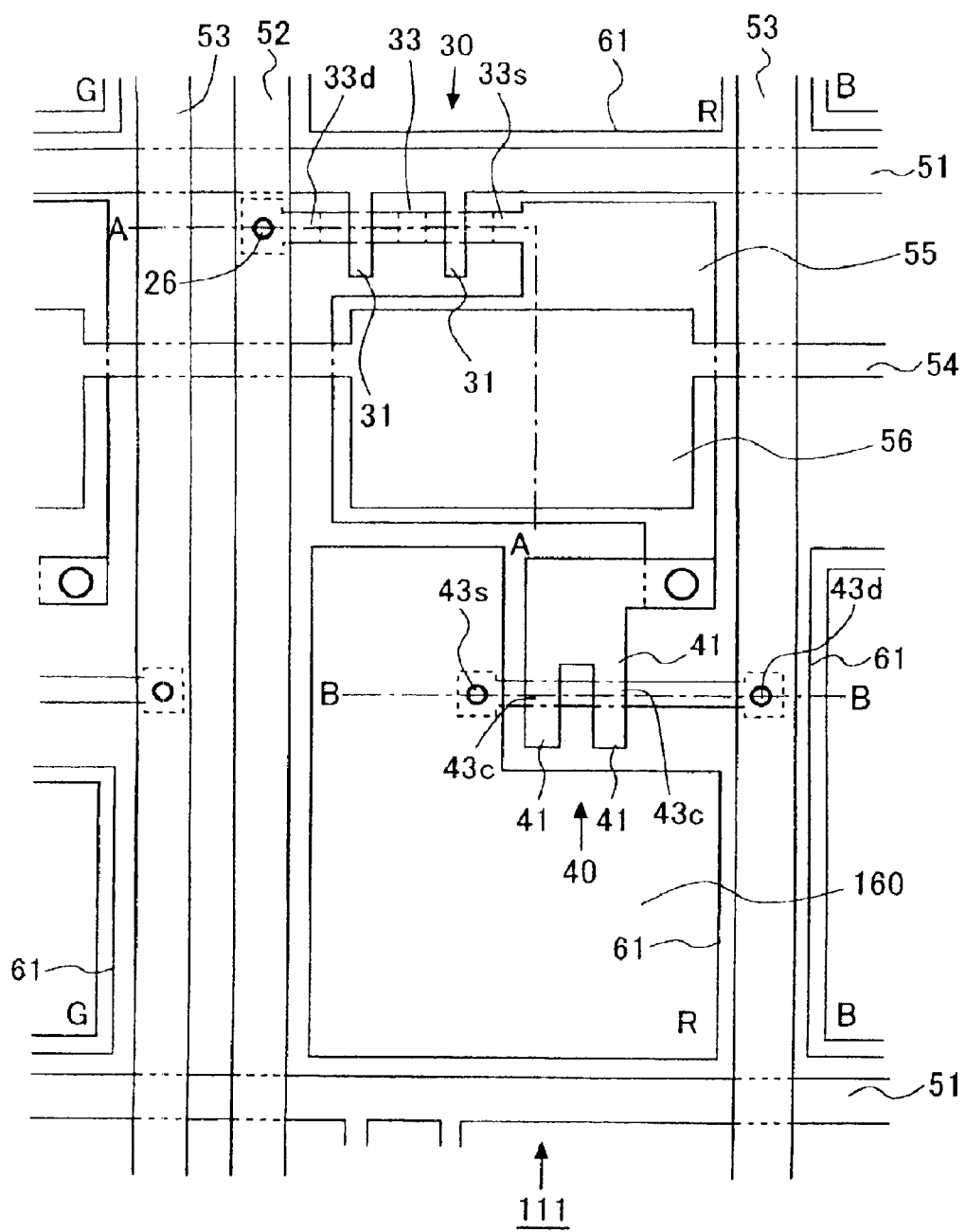
FIG. 13 is a plan view of an electroluminescenct display device of the third embodiment of this invention.
Figure 14A:
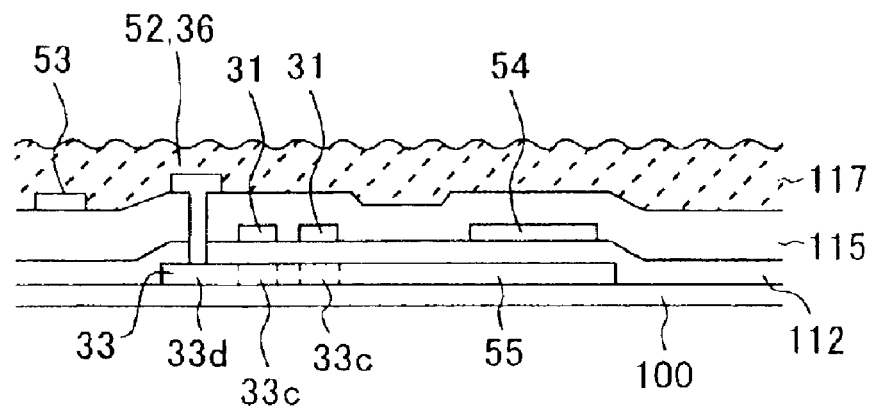
FIG. 14A is a cross-sectional view of the display device of the third embodiment along line A—A of FIG. 13.

FIG. 13 is a plan view showing a vicinity of a display pixel of an organic El display device. FIG. 14A is a cross-sectional view along with the A—A line, and the FIG. 14B is a cross-sectional view along with the B—B line in FIG. 13.

Figure 14B:
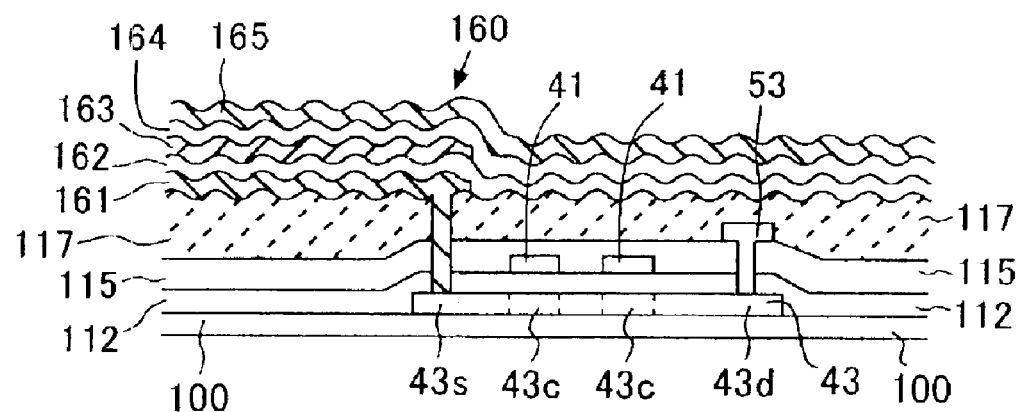
FIG. 14B is a cross-sectional view of the display device of the third embodiment along line B—B of FIG. 13.

A display pixel 111 is formed in the region surrounded with a gate signal line 51 and a drain signal line 52, and disposed in a matrix configuration, as shown in FIGS. 13, 14A and 14B.

An organic EL device 160, which is a light-emitting element, a switching TFT 30 for controlling the timing of supplying electric currents to the organic EL device 160, a driving TFT for supplying the electric current to the organic EL device 160, and a storage capacitance element are disposed in the display pixel 111. The organic EL device 160 includes an emissive layer, an anode 161 and a cathode 163.

A switching TFT, which is the first TFT 30, is disposed near the crossing of the signal lines 51 and 52. A source 33s of the TFT 30 also works as a capacitance electrode 55 that forms a capacitance with a storage capacitance electrode line 54, and is connected to a gate 41 of a second TFT 40, which is the TFT for driving the EL device. A source 43s of the second TFT is connected to the anode 161 of the organic EL device 60, and a drain 43*d* is connected to a driving source line 53, which is the source of the electricity supplied to the organic EL device 160.

The storage capacitance electrode line 54 is disposed in parallel with the gate signal line 51. The storage capacitance electrode line 54 is made of chrome and forms capacitance by accumulating electric charge with the capacitance electrode 55 connected to the source 33*s* of the TFT through a gate insulating film 112. A storage capacitance element 56 is disposed to store the voltage applied to the gate electrode 41 of the second TFT 40.

The TFT and the organic EL device are sequentially disposed on a substrate 100, which is either one of a substrate made of a glass substrate, a resin substrate, a conductive substrate or a semiconductor substrate, in the organic EL display device, as shown in FIGS. 14A and 14B. When the conductive substrate or the semiconductor substrate is used as the substrate 100, an insulating film made of $SiO_2$ or SiN should be disposed on the substrate first. Then the first and second TFTs and the organic EL device are formed. Both TFTs should have a top-gate configuration, where the gate electrodes are located above an active layer with the gate insulating film between them.

The description on the first TFT 30, the switching TFT will be made hereinafter.

As shown in FIG. 14A, an amorphous silicon film (referred to as a-Si film hereinafter) is formed through a CVD method on the insulating substrate 100, which is made of a quartz glass or a non-alkaline glass. The laser beam is lead to the a-Si film for recrystallization from melt, forming a poly-crystalline silicon film (referred to as a p-Si film, hereinafter). This functions as the active layer 33. Single layer or multiple layers of a $SiO_2$ film and a SiN film are formed on the p-Si film as the gate insulating film 112, on which the gate signal line 51 also working as a gate electrode 31 made of a metal with a high-melting point such as Cr and Mo and the drain signal line 52 made of Al are disposed. The driving source line 53 made of Al that is the source of the driving power of the organic EL device is also disposed.

A $SiO_2$ film, a SiN film and a $SiO_2$ film are sequentially disposed to form an interlayer insulating film 115 on the entire surface of the gate insulating film 112 and the active layer 33. A drain electrode 36, which is formed by filling a contact hole formed at the location corresponding to the drain 33*d* with a metal such as Al, is disposed, and a planarization insulating film 117 made of organic resin for planarization the surface is formed on the entire surface.

Next, the description on the second TFT 40, which is the TFT for driving the organic EL device, will be provided. As shown in FIG. 14B, an active layer 43, which is formed by irradiation of the laser beam for poly-crystallization, the gate insulating film 112, and a gate electrode 41 made of a metal with a high-melting point such as Cr and Mo are sequentially disposed on the insulating substrate 100, which is made of a quartz glass or a non-alkaline glass. A channel 43*c*, and a source 43*s* and a drain 43*d* located both sides of the channel 43*c* are formed in the active layer 43. A $SiO_2$ film, a SiN film and a $SiO_2$ film are sequentially disposed to form the interlayer insulating film 115 on the entire surface of the gate insulating film 112 and the active layer 43. The driving source line 53, which is connected to the driving source by filling a contact hole formed at the location corresponding to the drain 43*d* with a metal such as Al, is disposed. Furthermore, the planarization insulating film 117 made of organic resin for planarization the surface is formed on the entire surface. The concave and convex structure is formed on the surface of the planarization insulating film 117.

A contact hole corresponding to the location of the source 43*s* is formed in the planarization film 117. A transparent electrode made of ITO that is an anode 161 of an organic EL device 160 making a contact with a source 43*s* through the contact hole is formed on the planarization film 117. The anode 161 is formed separately, forming an island for each of the display pixel. The surface of the anode 161 has the concave and convex structure, reflecting the concave and convex structure on the planarization insulating film 117.

Then, a hole transportation layer 162, an emissive layer 163, an electron transportation layer 164, and a cathode 165 are disposed through the vacuum evaporation method using a shadow mask on the anode 161 with the concave and convex structure on the surface, as shown in FIG. 14B.

Each surface of the hole transportation layer 162, the emissive layer 163, the electron transportation layer 164, and the cathode 165 has the concave and convex structure reflecting the concave and convex structure of the anode 161. Therefore, the effective light-emitting area of the emissive layer 163 increases.

According to the display device and its manufacturing method of this invention, the effective surface area of the emissive layer increases, because the concave and convex structure is formed on the surface of the emissive layer of the EL device. Therefore, it is possible to achieve a higher brightness by increasing the effective light-emitting area of the organic EL device without leading to the enlargement of the pixel area. It is also possible to extend the life span of the EL device while keeping the light-emitting brightness at a conventional level.

What is claimed is:

1. A manufacturing method of an electroluminescent display device, comprising:

disposing a thin film transistor on a substrate;

disposing a planarization insulating film made of a photosensitive material over the thin film transistor;

performing a half exposure processing and a development processing on the planarization insulating film to form a concave and convex structure on a surface of the planarization insulating film;

disposing a mask with an opening portion on the surface of the planarization insulating film with the concave and convex structure;

performing a full exposure processing and a development processing on the planarization insulating film using the mask to form a contact hole in the planarization insulating film;

disposing an anode connected to a source or a drain of the thin film transistor through the contact hole;

disposing an emissive layer over the anode; and disposing a cathode over the emissive layer.

2. The manufacturing method of an electroluminescent display device of claim 1, wherein the disposing of the anode, the emissive layer and the cathode is such that the concave and convex structure of the planarization insulating film is reflected in corresponding surfaces of the anode, the emissive layer and the cathode.

3. A manufacturing method of an electroluminescent display device, comprising:

disposing a thin film transistor on a substrate;

disposing an insulating film over the thin film transistor;

forming a concave and convex structure on a top surface of the insulating film;

forming a contact hole in the insulating film with the concave and convex structure;

disposing an anode connected to a source or a drain of the thin film transistor through the contact hole;

disposing an emissive layer over the anode; and disposing a cathode over the emissive layer.

4. The manufacturing method of an electroluminescent display device of claim 3, wherein the disposing of the anode, the emissive layer and the cathode is such that the concave ana convex structure of the insulating film is reflected in corresponding surfaces of the anode, the emissive layer and the cathode.

5. The manufacturing method of an electroluminescent display device of claim 4, wherein the insulating film comprises a planarization film.

6. The manufacturing method of an electroluminescent display device of claim 3, wherein the forming of the concave and convex structure comprises disposing a photoresist layer on the top surface of the insulating film, performing an exposure processing and a development processing on the photoresist layer and etching the top surface of the insulating film by using the exposed and developed photoresist layer as an etching mask.

7. The manufacturing method of an electroluminescent display device of claim 3, wherein the forming of the concave and convex structure comprises disposing a photoresist layer on the top surface of the insulating film, performing a half exposure processing and a development processing on the photoresist layer and etching the photoresist layer and the insulating film.

8. The manufacturing method of an electroluminescent display device of claim 7, wherein the etching of the photoresist layer and the insulating film is performed by a reactive ion etching technique.

9. A manufacturing method of an electroluminescent display device, comprising:

disposing a thin film transistor on a substrate;

disposing an interlayer insulating film over the thin film transistor;

forming a plurality of convex portions made of an insulating film on a top surface of the interlayer insulating film;

disposing a planarization insulating film over the interlayer insulating film with the convex portions;

forming a contact hole in the planarization insulating film;

disposing an anode connected to a source or a drain of the thin film transistor through the contact hole;

disposing an emissive layer over the anode; and disposing a cathode over the emissive layer.

10. The manufacturing method of an electroluminescent display device of claim 9, wherein the disposing of the anode, the emissive layer and the cathode is such that the convex portions of the planarization insulating film are reflected in corresponding surfaces of the anode, the emissive layer and the cathode.

11. The manufacturing method of an electroluminescent display device of claim 9, wherein the forming of the convex portions comprises disposing an intermediate insulating film on the interlayer insulating film and patterning the intermediate insulating film to form the convex portions by a photolithographic process.

* * * * *